US011647654B2

(12) United States Patent
Park et al.

(10) Patent No.: US 11,647,654 B2
(45) Date of Patent: May 9, 2023

(54) ORGANIC LIGHT EMITTING DIODE, AND USING STRETCHABLE LIGHT-EMITTING MATERIAL AND A MANUFACTURING METHOD OF THEREOF

(71) Applicant: INDUSTRY-ACADEMIC COOPERATION FOUNDATION, YONSEI UNIVERSITY, Seoul (KR)

(72) Inventors: Jin-Woo Park, Seoul (KR); Jin-Hoon Kim, Seongnam-si (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 123 days.

(21) Appl. No.: 17/182,026

(22) Filed: Feb. 22, 2021

(65) Prior Publication Data
US 2021/0265443 A1  Aug. 26, 2021

(30) Foreign Application Priority Data
Feb. 24, 2020 (KR) ................ 10-2020-0022093

(51) Int. Cl.
*H10K 59/125* (2023.01)
*H10K 50/11* (2023.01)
*H10K 50/15* (2023.01)
*H10K 50/16* (2023.01)
*H10K 50/81* (2023.01)
*H10K 50/82* (2023.01)
*H10K 71/00* (2023.01)
*H10K 77/10* (2023.01)
*H10K 85/10* (2023.01)
*H10K 59/12* (2023.01)
*H10K 102/00* (2023.01)

(52) U.S. Cl.
CPC .......... *H10K 59/125* (2023.02); *H10K 50/11* (2023.02); *H10K 50/15* (2023.02); *H10K 50/16* (2023.02); *H10K 50/81* (2023.02); *H10K 50/82* (2023.02); *H10K 71/00* (2023.02); *H10K 77/111* (2023.02); *H10K 85/111* (2023.02); *H10K 85/1135* (2023.02); *H10K 85/141* (2023.02); *H10K 59/1201* (2023.02); *H10K 2102/311* (2023.02)

(58) Field of Classification Search
CPC .................. H01L 27/3276; H01L 27/3262
See application file for complete search history.

(56) References Cited

U.S. PATENT DOCUMENTS

| 9,391,286 | B1* | 7/2016 | Kwon | H01L 51/5275 |
| 9,844,133 | B2* | 12/2017 | Tomita | H05K 3/202 |
| 10,026,721 | B2* | 7/2018 | Kim | H01L 25/167 |
| 10,310,560 | B2* | 6/2019 | Choi | G06F 1/1652 |
| 10,608,071 | B2* | 3/2020 | Hong | H01L 27/3216 |
| 10,649,496 | B2* | 5/2020 | Choi | H01L 27/3276 |

(Continued)

FOREIGN PATENT DOCUMENTS

KR  101912036 B1  10/2018

*Primary Examiner* — Caleb E Henry
(74) *Attorney, Agent, or Firm* — McCoy Russell LLP

(57) ABSTRACT

The present disclosure relates to a stretchable organic light-emitting diode and a manufacturing method thereof, the stretchable organic light-emitting diode including: a stretchable driving unit including a stretchable field effect transistor (FET); and a stretchable light-emitting unit including an elastic material on the stretchable driving unit.

10 Claims, 9 Drawing Sheets

(56) References Cited

U.S. PATENT DOCUMENTS

| | | | | |
|---|---|---|---|---|
| 2003/0134488 | A1* | 7/2003 | Yamazaki | H01L 51/56 438/455 |
| 2004/0192082 | A1* | 9/2004 | Wagner | H05K 1/0283 439/67 |
| 2010/0330338 | A1* | 12/2010 | Boyce | H01L 23/4985 428/156 |
| 2012/0103683 | A1* | 5/2012 | Ishida | H05K 1/038 87/8 |
| 2013/0256921 | A1* | 10/2013 | Huang | H01L 24/82 257/786 |
| 2014/0299362 | A1* | 10/2014 | Park | H05K 1/0283 174/254 |
| 2015/0189741 | A1* | 7/2015 | Hong | H05K 1/0283 427/372.2 |
| 2016/0181346 | A1* | 6/2016 | Kwon | H01L 27/124 257/40 |
| 2016/0268352 | A1* | 9/2016 | Hong | H01L 27/3276 |
| 2016/0343866 | A1* | 11/2016 | Koezuka | H01L 29/045 |
| 2016/0365393 | A1* | 12/2016 | Kim | H01L 51/0097 |
| 2017/0033323 | A1* | 2/2017 | Chida | H01L 51/0097 |
| 2017/0139442 | A1* | 5/2017 | Yoshizumi | G04G 9/04 |
| 2017/0181277 | A1* | 6/2017 | Tomita | H05K 1/0283 |
| 2017/0256654 | A1* | 9/2017 | Yamazaki | H01L 29/7869 |
| 2017/0293171 | A1* | 10/2017 | Yamazaki | H01L 27/1251 |
| 2017/0301699 | A1* | 10/2017 | Yamazaki | H01L 29/7869 |
| 2017/0338108 | A1* | 11/2017 | Yamazaki | H01L 29/78696 |
| 2018/0046221 | A1* | 2/2018 | Choi | G02B 26/0825 |
| 2018/0114825 | A1* | 4/2018 | Hong | H01L 27/322 |
| 2019/0280077 | A1* | 9/2019 | Park | H10K 59/124 |
| 2020/0161276 | A1* | 5/2020 | Kim | H01L 25/0655 |
| 2020/0161403 | A1* | 5/2020 | Jung | H10K 50/814 |
| 2020/0168824 | A1* | 5/2020 | Park | H10K 59/131 |

\* cited by examiner

330

PEI

PFN

PEIE

Cs₂CO₃   Alq₃   CsF

ORGANIC LIGHT EMITTING DIODE, AND USING STRETCHABLE LIGHT-EMITTING MATERIAL AND A MANUFACTURING METHOD OF THEREOF

CROSS-REFERENCE TO RELATED APPLICATION

The present application claims priority to Korean Patent Application No. 10-2020-0022093 filed on Feb. 24, 2020. The entire contents of the above-listed application is hereby incorporated by reference for all purposes.

TECHNICAL FIELD

The following disclosure relates to a stretchable organic light-emitting diode and a manufacturing method thereof, and more particularly, to a technical idea to implement a stretchable organic light-emitting diode using a stretchable light-emitting material.

BACKGROUND

A current light-emitting diode used for a stretchable display may be manufactured through control of its structure.

In detail, the light-emitting diode may be manufactured by an "island interconnect" method of using the same diode manufactured on a rigid substrate, lowering the density of the diode, and forming a serpentine interconnect between the diodes, and by a "mechanical buckling" method of transferring a manufactured diode on a substrate to which a pre-strain is applied in advance, and then removing the strain to generate a buckling to give elasticity to the diode substrate.

The two methods described above have an advantage of being able to give elasticity to the diode substrate while using the existing diodes as they are. However, in a case of the "island interconnect" method, the diode may have a lower density and its manufacturing process may become very complicated. In a case of the "mechanical buckling" method, a transfer of the diode is required and it may thus be difficult to perform such a transfer in a large area. In addition, the diode substrate may have the elasticity in a direction to which the pre-strain is applied, but may have little elasticity in a direction perpendicular thereto, and it may thus be impossible for the diode substrate to have elasticity in various directions.

Meanwhile, in order to overcome the above-described disadvantages, a method is proposed in which a cathode and an anode which are based on a silver (Ag) nanowire are formed on a transparent polyurethane substrate.

However, this method may have a very high driving voltage of the diode, does not consider the elasticity of a hole transport layer, light-emitting layer and electron transport layer, and may thus be somewhat unreasonable to be used for the manufacture of a stretchable organic light-emitting diode.

RELATED ART DOCUMENT

Patent Document

Korean Patent Laid-Open Publication No. 10-1912036, entitled "Transparent Electrode and Manufacturing Method Thereof."

SUMMARY

An exemplary embodiment of the present disclosure is directed to providing an organic light-emitting diode capable of implementing a stretchable image by including a stretchable light-emitting unit including a hole transport layer, a light-emitting layer, an electron transport layer and a cathode, which are all formed using an elastic material and arranged on a stretchable driving unit, and a manufacturing method thereof.

Another exemplary embodiment of the present disclosure is directed to providing an organic light-emitting diode which may be produced by a solution process and transferred to a large area at a low voltage, and a manufacturing method thereof.

In one general aspect, a stretchable organic light-emitting diode includes: a stretchable driving unit including a stretchable field effect transistor (FET); and a stretchable light-emitting unit disposed on the stretchable driving unit and including an elastic material.

The stretchable light-emitting unit may include: a stretchable hole transport layer (HTL) including a conductive polymer; a stretchable light-emitting layer (EML) formed on the stretchable hole transport layer and including a light-emitting material; a stretchable electron transport layer (ETL) formed on the stretchable light-emitting layer and including a metal oxide nanoparticle; and a stretchable cathode formed on the stretchable electron transport layer and including a nanowire.

The stretchable hole transport layer may include a non-ionic surfactant and a conductive polymer nanofiber.

The stretchable light-emitting layer may include one or a combination of two selected from the group consisting of an elastic polymer and a plasticizer, and the light-emitting material.

The light-emitting material may include one or two or more selected from the group consisting of a fluorescent polymer, a fluorescent compound, a phosphorescent polymer and a phosphorescent compound, the elastic polymer includes one or two or more selected from the group consisting of a polybutadiene-based rubber, a silicone-based rubber and a polyethylene oxide-based rubber, and the plasticizer is the nonionic surfactant.

The stretchable electron transport layer may include an n-type semiconductor metal oxide nanoparticle and an amine-based polymer doped with an n-type dopant.

The stretchable driving unit may include the stretchable FET, a stretchable bit-line and a stretchable anode to control an on/off operation of each pixel of the stretchable light-emitting unit.

In another general aspect, a manufacturing method of a stretchable organic light-emitting diode includes: forming a stretchable driving unit including a stretchable field effect transistor (FET); and forming a stretchable light-emitting unit disposed on the stretchable driving unit and including an elastic material.

The forming of the stretchable light-emitting unit may include: forming a stretchable hole transport layer (HTL) including a conductive polymer; forming a stretchable light-emitting layer (EML) formed on the stretchable hole transport layer and including a light-emitting material; forming a stretchable electron transport layer (ETL) formed on the stretchable light-emitting layer and including a metal oxide nanoparticle; and forming a stretchable cathode formed on the stretchable electron transport layer and including a nanowire.

In the forming of the stretchable hole transport layer, a nonionic surfactant of a predetermined weight ratio may be added into a solution containing the conductive polymer to change a structure of the conductive polymer to a nanofiber structure.

In the forming of the stretchable light-emitting layer, the stretchable light-emitting layer may be formed by mixing one or two materials selected from the group consisting of an elastic polymer and a plasticizer with the light-emitting material.

The forming of the stretchable electron transport layer may include forming an n-type semiconductor metal oxide nanoparticle layer and forming an amine-based polymer layer doped with an n-type dopant.

Other features and aspects will be apparent from the following detailed description, the drawings and the claims.

The present disclosure may provide the stretchable organic light-emitting diode capable of implementing the stretchable image by including the stretchable light-emitting unit including the hole transport layer, the light-emitting layer, the electron transport layer and the cathode, which are all formed using the elastic material and arranged on the stretchable driving unit.

The present disclosure may provide the stretchable organic light-emitting diode which may be produced by the solution process and transferred to the large area at the low voltage, and the manufacturing method thereof.

DETAILED DESCRIPTION OF EMBODIMENTS

Figure 1:
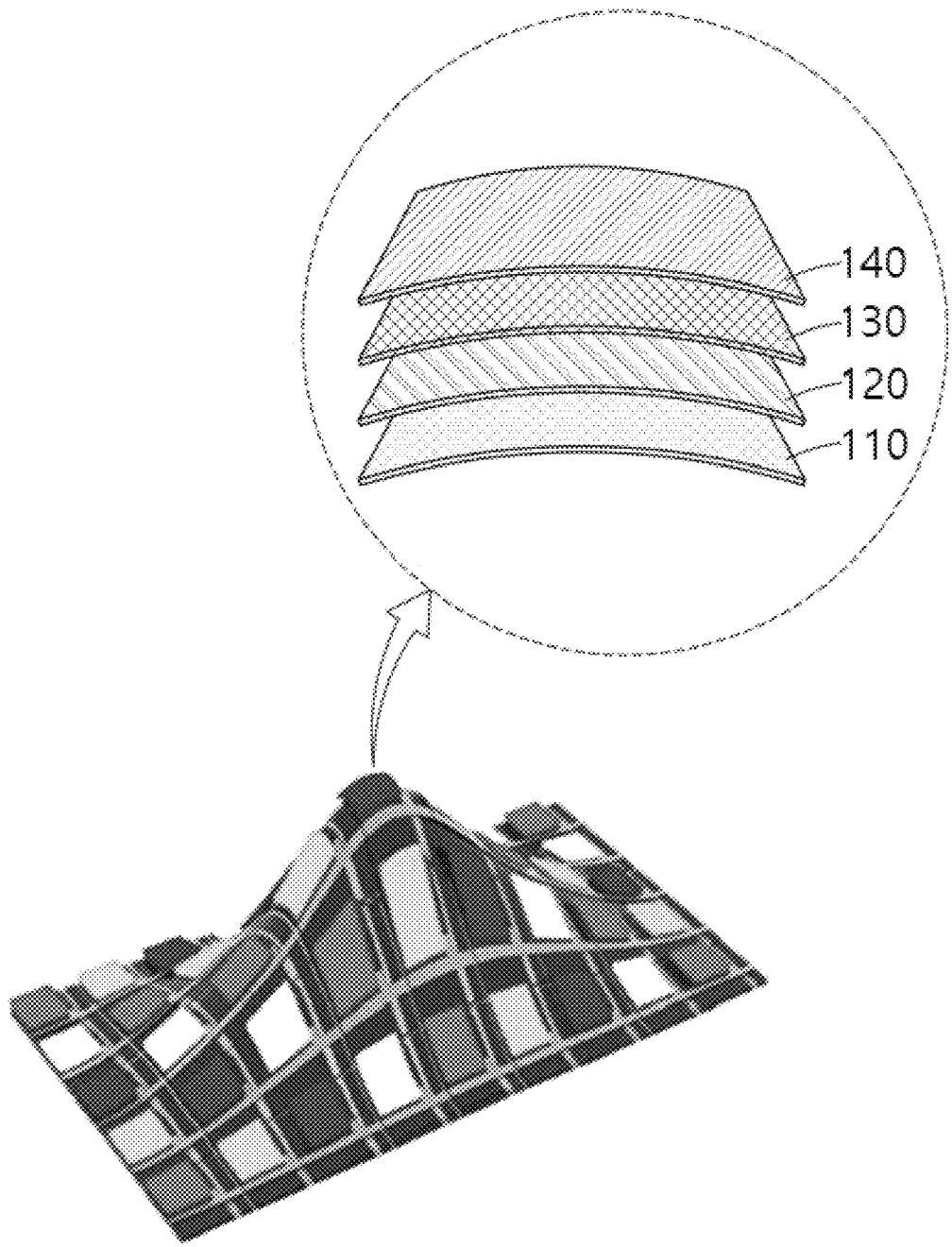
FIG. 1 is a view showing an exemplary embodiment of a stretchable light-emitting unit in one general aspect.

Hereinafter, an organic light-emitting diode using a stretchable light-emitting material and a manufacturing method thereof according to exemplary embodiments of the present disclosure as described above will be described in detail with reference to the accompanying drawings.

It is to be understood that exemplary embodiments and terms used herein are not intended to limit technologies described in the present disclosure to specific exemplary embodiments, but include various modifications, equivalents, and substitutions according to the exemplary embodiments of the present disclosure.

In the following description of the various embodiments, if it is determined that a detailed description of a related known function or configuration may unnecessarily obscure the gist of the present disclosure, a detailed description thereof will be omitted.

Further, the following terminologies are defined in consideration of the functions in the various embodiments and may be construed in different ways by the intention of users and operators. Therefore, these terms should be defined on the basis of the contents throughout the specification.

Throughout the accompanying drawings, similar components are denoted by similar reference numerals.

Singular forms may include plural forms unless the context clearly indicates otherwise.

In the present disclosure, an expression "A or B", "at least one of A and/or B", "one or more of A and/or B", or the like, may include all possible combinations of items enumerated together.

Expressions "first," "second" or the like may indicate corresponding components regardless of a sequence or importance of the components, will be used only in order to distinguish one component from the other components, and do not limit the corresponding components.

When it is mentioned that any component (for example, a first component) is (operatively or communicatively} coupled to or is connected to another component (for example, a second component), it is to be understood that any component is directly coupled to another component or may be coupled to another component through the other component (for example, a third component).

An expression "configured (or set) to" used in the present disclosure may be used interchangeably with an expression "suitable for", "having the capacity to", "adapted to", "made to", "capable of", and ", "designed to" in hardware or software, for example, depending on a situation.

In some situations, an expression "an apparatus configured to" may mean that the apparatus may "do" something together with other apparatuses or components.

For example, a "processor configured (or set) to perform A, B, and C" may mean a dedicated processor (for example, an embedded processor) for performing the corresponding operations or a generic-purpose processor (for example, a central processing unit (CPU) or an application processor) that may perform the corresponding operations by executing one or more software programs stored in a memory apparatus.

In the specific exemplary embodiments described above, components included in the present disclosure may have singular or plural forms according to the specific embodiments presented.

However, the singular or plural form is selected appropriately for the situation presented for convenience of description, and the above-described exemplary embodiments are not limited to the singular or plural components, and even a component expressed in the plural form may be singular in number, or even a component expressed in the singular form may be plural in number.

Meanwhile, although specific exemplary embodiments are described in the description of the present disclosure, various modifications may be made without departing from the scope and spirit of the present disclosure, which are implied by the various exemplary embodiments.

Accordingly, the scope of the present disclosure is not construed as being limited to the described exemplary embodiments but is defined by the appended claims as well as equivalents thereto.

In one general aspect, the present disclosure relates to a stretchable organic light-emitting diode including a stretchable driving unit including a stretchable field effect transistor (FET) and a stretchable light-emitting unit disposed on the stretchable driving unit and including an elastic material to perform a function as a display by controlling an on/off operation of the display.

In one general aspect, the organic light-emitting diode may implement both the stretchable driving unit and the stretchable light-emitting unit in an elastic material to implement its deformation not only in uniaxial directions (x-axis and y-axis), but also in three-dimensional directions (x-axis, y-axis and z-axis).

Hereinafter, the description describes the stretchable light-emitting unit in detail as follows.

In one general aspect, the stretchable light-emitting unit may include: a stretchable hole transport layer (HTL) including a conductive polymer; a stretchable light-emitting layer (EML) formed on the stretchable hole transport layer and including a light-emitting material; a stretchable electron transport layer (ETL) formed on the stretchable light-emitting layer and including a metal oxide nanoparticle; and a stretchable cathode formed on the stretchable electron transport layer and including a nanowire.

The description describes a specific configuration of the stretchable light-emitting unit in detail with reference to an exemplary embodiment and FIG. 1 below. FIG. 1 is a view showing an exemplary embodiment of a stretchable light-emitting unit 100 in one general aspect.

Referring to FIG. 1, the stretchable light-emitting unit 100 according to an exemplary embodiment may include a stretchable hole transport layer (HTL) 110, a stretchable light-emitting layer (EML) 120, a stretchable electron transport layer (ETL) 130 and a stretchable cathode 140.

Figure 3:
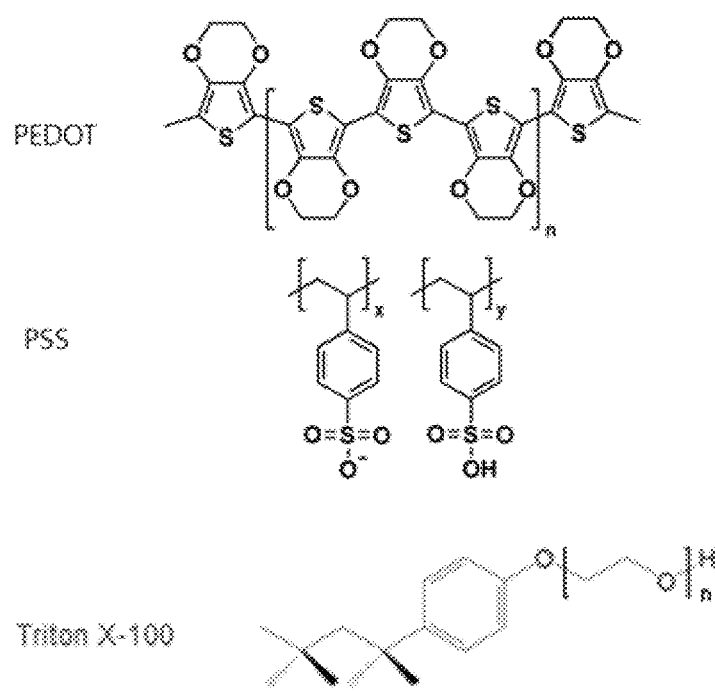
FIGS. 3 to 5 are views each showing an example of a material forming the stretchable light-emitting unit in one general aspect.
Figure 4:
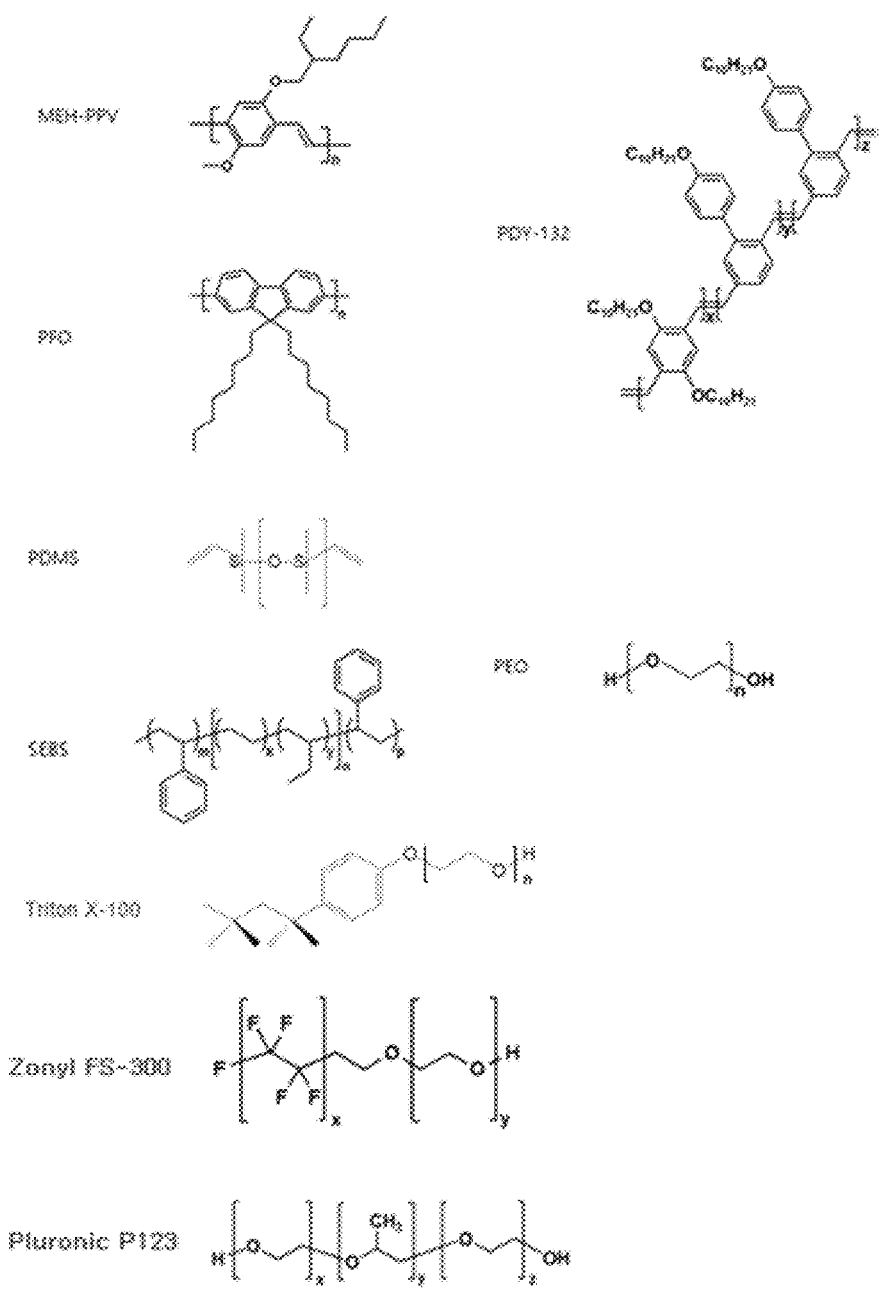
Figure 5:
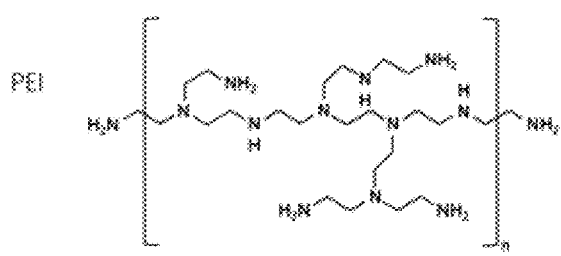
Figure 5:
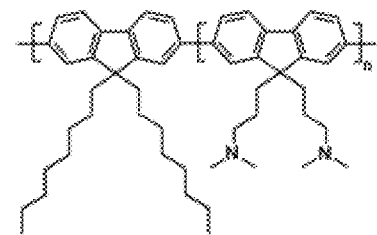
Figure 5:
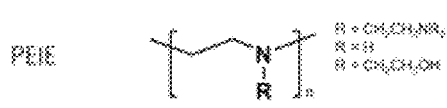
Figure 5:
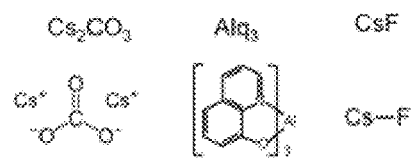

That is, the stretchable light-emitting unit 100 may be a sequential stacking of a stretchable hole transport layer 110, a stretchable light-emitting layer 120, a stretchable electron transport layer 130 and a stretchable cathode 140. The stretchable light-emitting unit 100 may refer to a light-emitting unit having a stacked structure in which each layer is independently implemented in an elastic material, and each layer independently has its stretchable property. The elastic materials forming the stretchable light-emitting unit may be shown in FIGS. 3 to 5.

Stretchable Hole Transport Layer

In one general aspect, the stretchable hole transport layer 110 may include a conductive polymer. In detail, the stretchable hole transport layer 110 may include a nonionic surfactant and a conductive polymer nanofiber and the like, and the conductive polymer nanofiber is derived from the conductive polymer.

In detail, the conductive polymer nanofiber may be formed by adding the nonionic surfactant into a solution containing a conductive polymer. In more detail, the solution may be prepared by mixing a solvent and the conductive polymer, the conductive polymer may be phase-separated and self-assembled in the solution by adding the nonionic surfactant of a predetermined optimal weight ratio into the solution, and the conductive polymer may thus form a structure of the nanofiber.

Manufacturing operations of the stretchable hole transport layer 110 are described in more detail as follows. The manufacturing operations of the stretchable hole transport layer 110 may include: an operation S1 preparing a conductive polymer solution by mixing the solvent and the conductive polymer; an operation S2 preparing a mixed solution by adding the nonionic surfactant to the solution containing the conductive polymer; an operation S3 stirring the mixed solution; an operation S4 preparing a thin film by spin coating the stirred mixed solution; and an operation S5 heat-treating the thin film at a high temperature, to form the stretchable conductive polymer nanofiber on the hole transport layer 110 from a series of operations over time.

The stretchable hole transport layer 110 may be formed by spin coating the conductive polymer solution on a stretchable anode of the stretchable driving unit.

The stretchable hole transport layer 110 may be formed on the stretchable anode of the stretchable driving unit to have a thickness of 10 to 300 nm, specifically 50 to 200 nm, and more specifically 70 to 150 nm.

Here, the anode may be formed to have a thickness of about 10 to 200 nm, specifically 30 to 150 nm, and more specifically 50 to 100 nm.

The conductive polymer nanofiber and nonionic surfactant prepared from the series of operations over time may be included in the hole transport layer 110 in a weight ratio of 1:1 to 1:20, specifically 1:2 to 1:10, and more specifically, 1:3 to 1:6.

In the operation S1, in order to form the conductive polymer nanofiber, a concentration of the conductive polymer may be 0.1 to 10% by weight, specifically 0.5 to 5% by weight, and more specifically, 1.3 to 1.7% by weight based on the total weight of the conductive polymer solution.

The solvent used to prepare the conductive polymer solution may preferably be water, and accordingly, the conductive polymer solution may be an aqueous conductive polymer solution.

For preferable example, to manufacture the stretchable hole transport layer 110, a water-alcohol co-solvent containing more alcohol may be used to dilute the concentration of the aqueous conductive polymer solution and lower its viscosity. The weight ratio of water and alcohol contained in the co-solvent may be 1:2 to 2:1.

Without limitation, the alcohol may be one of C1 to C4 alcohols, and specifically, may be a mixture of ethyl alcohol (ethanol) and isopropyl alcohol (isopropyl alcohol). The alcohol may be prepared by having Ethyl alcohol and isopropyl alcohol mixed in a weight ratio of 1:10 to 10:1, and more specifically, added in a weight ratio of 2:1 to 1:2.

In the operation S2, the mixed solution may be prepared by adding the nonionic surfactant to the conductive polymer solution. Without limitation, the nonionic surfactant may be added in a form that is not dissolved in the solvent. The conductive polymer and the nonionic surfactant may be mixed in a weight ratio of 1:1 to 1:20, specifically 1:2 to 1:10, and more specifically 1:3 to 1:6.

In the operation S3, the mixed solution may be stirred at a speed of 100 to 1,000 rpm for 2 to 10 hours, and preferably at 300 to 500 rpm for 4 to 8 hours. Under the above condition, the nanofibers may be more uniformly formed in the solution, which may be preferable. Without limitation, the stirred mixed solution may further include removing a large particle before performing the spin coating.

In order to prepare the thin film in the operation S4, the spin coating of the mixed solution may be performed on a stretchable anode at 500 to 2,000 rpm, but is not limited thereto.

After manufacturing the thin film, the operation S5 may include the heat-treating of the thin film at a high temperature to remove the solvent remaining in the thin film, in which the thin film may be heat-treated at a temperature of 80 to 130° C. for 5 to 30 minutes, and more specifically, heat-treated at a temperature of 90 to 130° C. for 10 to 20 minutes, and is not limited thereto.

The conductive polymer nanofiber is a fibrous polymer having a very high aspect ratio, and a plurality of the conductive polymer nanofibers may be produced in the solution by the nonionic surfactant.

The plurality of conductive polymer nanofibers may make electrical contact with each other by forming a mesh structure, and the conductive polymer nanofiber having the mesh structure may exhibit high stretchability when a strain is applied thereto. The conductive polymer nanofiber may have high mechanical stability and stable hole transport property by maintaining sufficient electrical contact with each other by the net structure even under the high strain.

An average diameter of the conductive polymer nanofiber may be 1 to 200 nm, specifically 5 to 100 nm, and more specifically 10 to 30 nm, and its aspect ratio may be 5 or more, and specifically 10 or more.

Without limitation, the conductive polymer may be the positively or negatively charged ionic conductive polymer, and more specifically, may be a mixture of a cationic conductive polymer and an anionic conductive polymer. A specific example of the conductive polymer may be PEDOT:PSS (poly(3,4-ethylenedioxythiophene):polystyrene sulfonate), and a weight ratio of PEDOT and PSS may be 1:1 to 1:20, specifically 1:2 to 1:10, and more specifically, 1:4 to 1:8.

The nonionic surfactant may preferably be a polyethylene oxide (PEO)-based nonionic surfactant to which an ethylene oxide structural unit is added, and its specific example may be Triton X-100. As the PEO-based nonionic surfactant is mixed, the conductive polymer may be effectively phase-separated and self-assembled in the solution to form the conductive polymer having a nanofiber structure.

In general, the PEDOT:PSS has a flexible property. However, it is known that when a strain exceeding a threshold value is applied thereto, mechanical breakage occurs therein, and its elasticity may thus be limited.

However, in one preferred general aspect according to the present disclosure, the mechanical elasticity of the PEDOT:PSS may be remarkably improved by changing the structure of the PEDOT:PSS into a form of the nanofiber through the above-described method. The PEDOT:PSS conductive nanofiber may be formed in the stretchable hole transport layer 110. Therefore, even if the strain is applied thereto, its hole transport property may not be substantially deteriorated due to high elasticity of the PEDOT:PSS conductive nanofiber, and the stretchable hole transport layer 110 may thus perform its function As a specific example, Triton X-100 which is the nonionic surfactant, may be added to the PEDOT:PSS aqueous solution obtained in the operation S1 to prepare the mixed solution in the operation S2, and the PEDOT:PSS may be changed to have the nanofiber structure through the stirring in the operation S3. In the aqueous solution, the weight ratio of PEDOT:PSS and nonionic surfactant may be 1:1 to 1:20, specifically 1:2 to 1:10, and more specifically 1:3 to 1:6.

Stretchable Light-Emitting Layer

In one general aspect, the stretchable light-emitting layer 120 may be formed on the stretchable hole transport layer 110 and may include the light-emitting material. In detail, the stretchable light-emitting layer 120 may include one or a combination of two selected from the group consisting of the elastic polymer, a plasticizer and the like, and the light-emitting material.

The stretchable light-emitting layer 120 may be manufactured by at least one method selected from a polymer blending method and a plasticizer addition method. As a specific example, the elastic polymer or the plasticizer and the light-emitting material may be included in the stretchable light-emitting layer 120 by the polymer blending method in which the elastic polymer and the light-emitting material are mixed with each other or the plasticizer addition method in which the plasticizer and the light-emitting material are mixed with each other.

The light-emitting material may include one or two or more selected from the group consisting of a fluorescent polymer, a fluorescent compound, a phosphorescent polymer, a phosphorescent compound, etc.

The fluorescent polymer may include one or two or more selected from the group consisting of a polythiophene polymer, a poly-p-pheneylene polymer, a poly-p-pheneylenevinylene polymer, a polyfluorene polymer, a polyarylenevinylene polymer, etc. Its specific example may include polyparaphenylene vinylene (MEH-PPV), PFO(poly(9,9-dioctylfluorene)), Poly-phenylene vinylene derivative (PDY-132), etc.

An example of the fluorescent compound may include an organic tea compound (Alq3), 4-(Dicyanomethylene)-2-tert-butyl-6-(1,1,7,7-tetramethyljulolidin-4-yl-vinyl)-4H-pyran, 4-(dicyanomethylene)-2-tert-butyl-6-(1,1,7,7-tetramethyl-julolidin-4-yl-vinyl)-4H-pyran (DCJTB), tetraphenyldibenzoperiflanthene (DBP), etc.

The phosphorescent polymer may be a host semiconductor polymer doped with the phosphorescent compound having a low molecular weight. A specific example may include a polymer doped with 1,3-bis[2-(4-tert-butylphenyl)-1,3,4-oxadiazo-5-yl]benzene (OXD-7) in poly (n-vinylcarbazole), a polymer doped with platinum(II) 2,3,7,8,12,13,17,18-octaethyl-21H,23H-porphyrin (PtOEP) in poly (9,9-dioctylfluorene), etc.

A specific example of the phosphorescent compound may include: an iridium-based complex such as Ir(ppy)3 (Tris(2-phenylpyridine)-iridium(III)), Ir(Fppy)3 (Tris(2-(4,6-difluorophenyl)pyridine)iridium(III)) or Ir(DPF)3 (Tris[9,9'-dihexyl-2-(pyridinyl-2')fluorene] iridium) or the like; or a platinum-based complex such as platinum(II) 2,3,7,8,12,13,17,18-octaethyl-21H,23H-porphyrin (PtOEP), etc.

The elastic polymer used in the polymer blending method may include one or two or more selected from the group consisting of a polybutadiene-based rubber, a silicone-based rubber, a polyethylene oxide-based rubber, etc. As a specific example, the elastic polymer may include polydimethylsiloxane (PDMS), polyethylene oxide (PEO), poly(styrene-butadiene-styrene) block copolymer (SBS) and poly(styrene-ethylene-butadiene-styrene) block copolymer (SEBS), etc.

The plasticizer used in the plasticizer addition method may be the nonionic surfactant, and specifically, may be the PEO-based nonionic surfactant to which an ethylene oxide structural unit is added. In detail, its example may include Triton X-100 (Polyoxyethylene octyl phenyl ether), Poly(ethylene glycol)-block-poly(propylene glycol)-block-poly(ethylene glycol) (Pluronic P123) and Zonyl FS-300.

It is preferable that the light-emitting material may be selected from a light-emitting polymer, i.e., the fluorescent polymer, the phosphorescent polymer or the like, and the silicone-based rubber or the PEO-based nonionic surfactant exhibits excellent elasticity when mixed with the light-emitting polymer and thus be selected.

As a specific example, the light-emitting polymer may have poor elasticity and a brittle material like the PEDOT:PSS. However, one general aspect of the present disclosure may preferably implement the stretchable light-emitting layer by mixing the elastic polymer or the plasticizer in the light-emitting polymer to control its mechanical property and give the elasticity to the light-emitting layer.

Meanwhile, in one general aspect, its light-emitting property may have minimized deterioration by mixing the light-emitting material and the elastic polymer or the plasticizer at a predetermined optimal weight ratio. For example, the light-emitting material and the elastic polymer or the plasticizer may be mixed with each other in a weight ratio of 3:1 to 1:3, specifically, in a weight ratio of 2:1 to 1:2, and preferably in a weight ratio of 1:0.9 to 0.9:1.

In one general aspect, the polymer blending method and the plasticizer addition method for preparing the stretchable light-emitting layer may be performed using the solvent, and the solvent is not limited as long as the solvent is capable of dissolving each of the light-emitting material and the elastic polymer or the plasticizer. As a specific example, it is possible to use at least one solvent selected from the group consisting of tetrahydrofuran (THF), toluene, chlorobenzene, chloroform, xylene, 1,2-dichloromethane, etc.

In one general aspect, a concentration of a polymer blend solution, in which the light-emitting material and the elastic polymer or the plasticizer are mixed with each other, may be 0.1 to 100 mg/ml, specifically 1 to 10 mg, and more specifically 4 to 8 mg/ml.

In one general aspect, in a case of the polymer blend solution in which the light-emitting material and the elastic polymer are mixed with each other, a mixing temperature to prepare the solution may be increased to 60 to 80° C. and the two components may be mixed with each other at this temperature. However, this temperature is only an example and is not limited thereto. Meanwhile, in a case of the polymer blend solution in which the light-emitting material and the plasticizer are mixed with each other, the mixing temperature to prepare the solution may be a room temperature (25° C.). However, this temperature is only an example and is not limited thereto.

The stretchable hole transport layer 120 may be formed on the stretchable hole transport layer 110 to have a thickness of 10 to 300 nm, specifically 50 to 180 nm, and more specifically 70 to 130 nm.

In one general aspect, the stretchable light-emitting layer 120 may be formed by spin coating the polymer blend solution.

For example, the spin coating may be performed at 1,500 to 4,000 rpm to form the stretchable light-emitting layer 120, and the heat treatment may be performed at a temperature of 80 to 120° C. for 10 to 30 minutes to remove the solvent remaining after the spin coating, and is not limited thereto.

The stretchable light-emitting layer 120 from which the solvent is removed may be the polymer blend including the light-emitting material, may have a fine phase-separated structure together with the elastic polymer or the plasticizer included in the light-emitting material, and specifically, may have a bicontinuous structure. It is possible to suppress the deterioration of the light-emitting property of the light-emitting material through the fine phase-separated structure.

Stretchable Electron Transport Layer

In one general aspect, the stretchable electron transport layer 130 may be formed on the stretchable light-emitting layer 120 and may include a metal oxide nanoparticle. The metal oxide nanoparticle may preferably be an n-type semiconductor metal oxide nanoparticle.

In detail, the stretchable electron transport layer 130 may be formed by mixing the n-type semiconductor metal oxide nanoparticle and an amine-based polymer doped with an n-type dopant.

In general, the nanoparticle such as the metal oxide nanoparticle may not be easily destroyed even when the strain is applied thereto. The reason is that there is little stress acting on the material due to its structural property such as the nanowire, and the amine-based polymer may give the high elasticity to the electron transport layer due to its strong hydrogen bonding.

In one aspect, it may be preferable that: the electron transport layer 130 has a structure in which the metal oxide nanoparticle and the amine-based polymer are stacked on each other; accordingly, due to an interaction between the metal oxide nanoparticle and the amine-based polymer, the electron transport layer 130 may have the high elasticity not to be easily destroyed even when the strain is applied thereto; the electron transport property of the electron transport layer 130 may not be substantially deteriorated due to its high elasticity; and the stretchable electron transport layer 130 may thus stably perform its function.

In detail, the n-type semiconductor metal oxide nanoparticle may include zinc oxide (ZnO) or titanium dioxide (TiO2). An average particle diameter of the metal oxide nanoparticle may be 1 to 500 nm, and specifically 10 to 100 nm.

The metal oxide nanoparticle may be prepared by being dispersed in the polar solvent, and in this case, the polar solvent may be the alcohol-based solvent. A specific example of the alcohol-based solvent may include at least one selected from ethanol, isopropyl alcohol, 2-ethoxy ethanol and 2-methoxy ethanol. A concentration of the metal oxide nanoparticle in the solution may be 0.1 to 10% by weight, specifically 1 to 5% by weight, and more specifically 2 to 4% by weight based on the total weight of the solution.

In addition, the metal oxide nanoparticle may be formed through spin coating a dispersion of the metal oxide nanoparticle on the stretchable light-emitting layer 120, and the spin coating may be performed at 1,000 to 3,000 rpm. Additionally, the heat treatment may be performed at a temperature of 80 to 120° C. for 10 to 30 minutes to remove the solvent remaining after the spin coating, and through this treatment, the stretchable electron transport layer including the metal oxide nanoparticle may be formed on the stretchable light-emitting layer 120.

Meanwhile, the amine-based polymer may include at least one selected from the group consisting of polyethyleneimine (PEI), polyethyleneimine (PEI), ethoxylated polyethyleneimine (PEIE), poly (9,9-bis(3'-(N,N-dimethylamino)propyl)-2,7-fluorene)-alt-2,7-(9,9-dioctylfluorene)] (PFN), etc.

In addition, the amine-based polymer may be doped with the n-type dopant to improve its electron transport property, and the n-type dopant may include at least one selected from cesium carbonate (CsCO3), organic tea compounds (Alq3) and cesium fluoride (CsF).

The solution of the amine-based polymer doped with the n-type dopant may be prepared by being dispersed in the polar solvent, and in this case, the polar solvent may be the alcohol-based solvent. A specific example of the alcohol-based solvent may include at least one selected from ethanol, isopropyl alcohol, 2-ethoxy ethanol and 2-methoxy ethanol. A concentration of the amine-based polymer in the solution may be 1.0 to 2.5% by weight based on the total weight of the solution.

In addition, the amine-based polymer and the n-type dopant may be mixed with each other in a weight ratio of 10:1 to 30:1, and the n-type dopant may thus be preferably doped to the amine-based polymer.

The amine-based polymer doped with the n-type dopant may be formed on the metal oxide nanoparticle layer through the spin coating, and the spin coating may be performed at 1,000 to 5,000 rpm. Additionally, the heat treatment may be performed at a temperature of 80 to 120° C. for 10 to 30 minutes to remove the solvent remaining after the spin coating.

Through the process as described above, it is possible to form the stretchable electron transport layer manufactured by stacking the metal oxide nanoparticle layer and the amine-based polymer layer doped with the n-type dopant on the stretchable light-emitting layer 120. When a unit layer is a layer in which the metal oxide nanoparticle layer and the amine-based polymer layer doped with the n-type dopant are stacked on each other, its stacked structure including unit layers 1 to 10 may be the stretchable electron transport layer, and the number of the unit layer is not limited thereto.

The stretchable electron transport layer 130 may be formed on the stretchable light-emitting layer 120 to have a thickness of 50 to 500 nm, specifically 80 to 300 nm, and more specifically 100 to 200 nm.

Stretchable Cathode

In one general aspect, the stretchable cathode 140 may be formed on the stretchable electron transport layer 130 and may include the nanowire.

For example, the stretchable cathode 140 may be formed on the amine-based polymer of the stretchable light-emitting layer 120, and may include a conductive nanowire. The conductive nanowire may be a silver nanowire or a copper nanowire, and may further include at least one material selected from the PEDOT:PSS and a carbon nanotube (CNT). The conductive nanowire may preferably be the silver nanowire.

In detail, the silver nanowire of the stretchable cathode 140 may be the nanowire having a diameter of several tens of nm and a length of several tens to several hundreds of um, and the stretchable cathode 140 may have electrical conductivity by having the plurality of nanowires forming the mesh structure. The stretchable cathode 140 may secure the high mechanical stability compared to a silver thin film because the stress applied to the material may be dispersed when the strain is applied thereto through the nanowire having the mesh structure.

In detail, the silver nanowire of the stretchable cathode 140 may be dispersed in the solvent at a concentration of 1 to 10 mg/ml, and preferably 2 to 5 mg/ml. The solvent may be the alcohol-based solvent, and specifically, may include at least one of ethanol and isopropyl alcohol.

In addition, the stretchable cathode 140 may be formed on the stretchable electron transport layer 130 through the spin coating or a spray coating of the dispersion of the silver nanowire, and the heat treatment may be performed at a temperature of 90 to 120° C. for 10 to 30 minutes to remove the solvent remaining after the spin coating.

The stretchable cathode 140 may be formed on the stretchable electron transport layer 130 to have a thickness of 10 to 300 nm, specifically 30 to 200 nm, and more specifically 50 to 100 nm.

Upper Electron Transport Layer

Meanwhile, the stretchable light-emitting unit 100 in one general aspect may further have an upper electron transport layer formed on the stretchable cathode 140 in order to reduce its current leakage and increase its electrical stability.

Here, the upper electron transport layer may use the same material as the stretchable electron transport layer 130 and may be manufactured by the same manufacturing method as the stretchable electron transport layer 130. The material and method used for the upper electron transport layer may be outlined as follows.

In one general aspect, the metal oxide nanoparticle layer of the upper electron transport layer may be formed on the stretchable cathode 140 through the spin coating, and the spin coating may be performed at 1,000 to 3,000 rpm.

In addition, after the spin coating, the heat treatment may be performed at a temperature of 80 to 120° C. for 10 to 30 minutes to remove the remaining solvent, thereby forming the metal oxide nanoparticle layer of the upper electron transport layer.

The amine-based polymer layer of the upper electron transport layer, which is doped with the n-type dopant may be formed through the spin coating performed on the metal oxide nanoparticle layer of the upper electron transport layer, and the spin coating may be performed at 3,000 to 5,000 rpm.

In addition, after the spin coating, the heat treatment may be performed at a temperature of 80 to 120° C. for 10 to 30 minutes to remove the remaining solvent, thereby forming the doped amine-based polymer layer of the upper electron transport layer.

The upper electron transport layer may be formed on the stretchable cathode 140 to have a thickness of 10 to 300 nm, specifically 30 to 200 nm, and more specifically 50 to 100 nm.

Hereinafter, the description describes the stretchable driving unit in detail as follows.

In one general aspect, the stretchable driving unit may have the stretchable field effect transistor (FET).

For example, the stretchable driving unit may control the on/off operation of the organic light-emitting diode using a switch unit made of a thin film transistor (TFT).

In one general aspect, the stretchable FET may be formed of at least one of the carbon nanotube and the nanowire.

Figure 2:
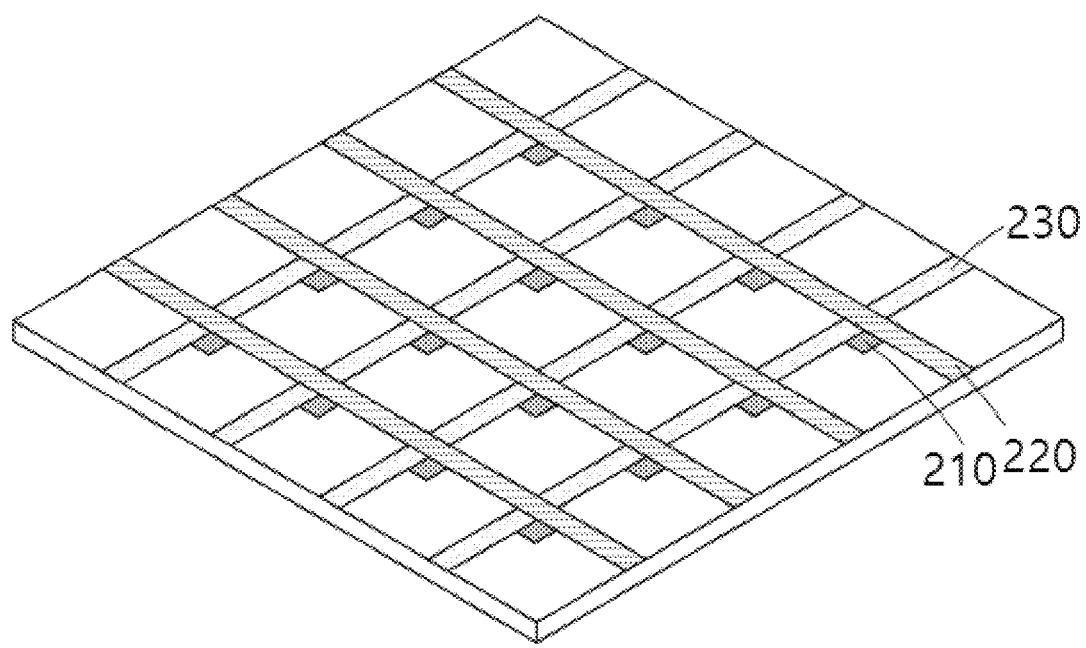
FIG. 2 is a view showing an exemplary embodiment of a stretchable driving unit in one general aspect.

FIG. 2 is a view showing an exemplary embodiment of a stretchable driving unit in one general aspect. Referring to FIG. 2, the stretchable driving unit 200 may include a stretchable FET 210, a stretchable bit-line 220 and a stretchable anode 230 to control an on/off operation of each pixel of the stretchable light-emitting unit.

In detail, the stretchable FET 210 may include a source electrode formed of at least one material among the carbon nanotube (CNT) and the nanowire, a drain electrode, a gate electrode, a channel material including the CNT or semiconductor polymer having a semiconductor property, and a gate dielectric film formed of the elastic polymer.

For example, the semiconductor polymer included in the channel material may include any one or two or more selected from the group consisting of poly(3-hexylthiophene, P3HT), pentacene, Poly [2-methoxy, 5-(2'-ethylhexyloxy)-p-phenylene-vinylene](MEH-PPV) and polyaniline.

For example, the nanowire included in the source electrode may be the conductive nanowire, and may be the silver nanowire or the copper nanowire. However, the nanowire is not limited thereto as long as the nanowire has conductivity.

In addition, the gate dielectric film may be the elastic polymer, and specifically, may include at least one of polydimethylsiloxane (PDMS), polyethylene oxide (PEO), poly(styrene-butadiene-styrene) block copolymer (SBS), poly(styrene-ethylene-butadiene-styrene) block copolymer (SEBS) and polyurethane (PU).

Meanwhile, the stretchable anode 230 may be formed using the same material and method as the stretchable cathode described with reference to FIG. 1, and accordingly, its detailed description is omitted.

In another general aspect, the present disclosure relates to a manufacturing method of a stretchable organic light-emitting diode, the method including: forming a stretchable driving unit including a stretchable field effect transistor (FET); and forming a stretchable light-emitting unit disposed on the stretchable driving unit and including an elastic material.

Figure 6:
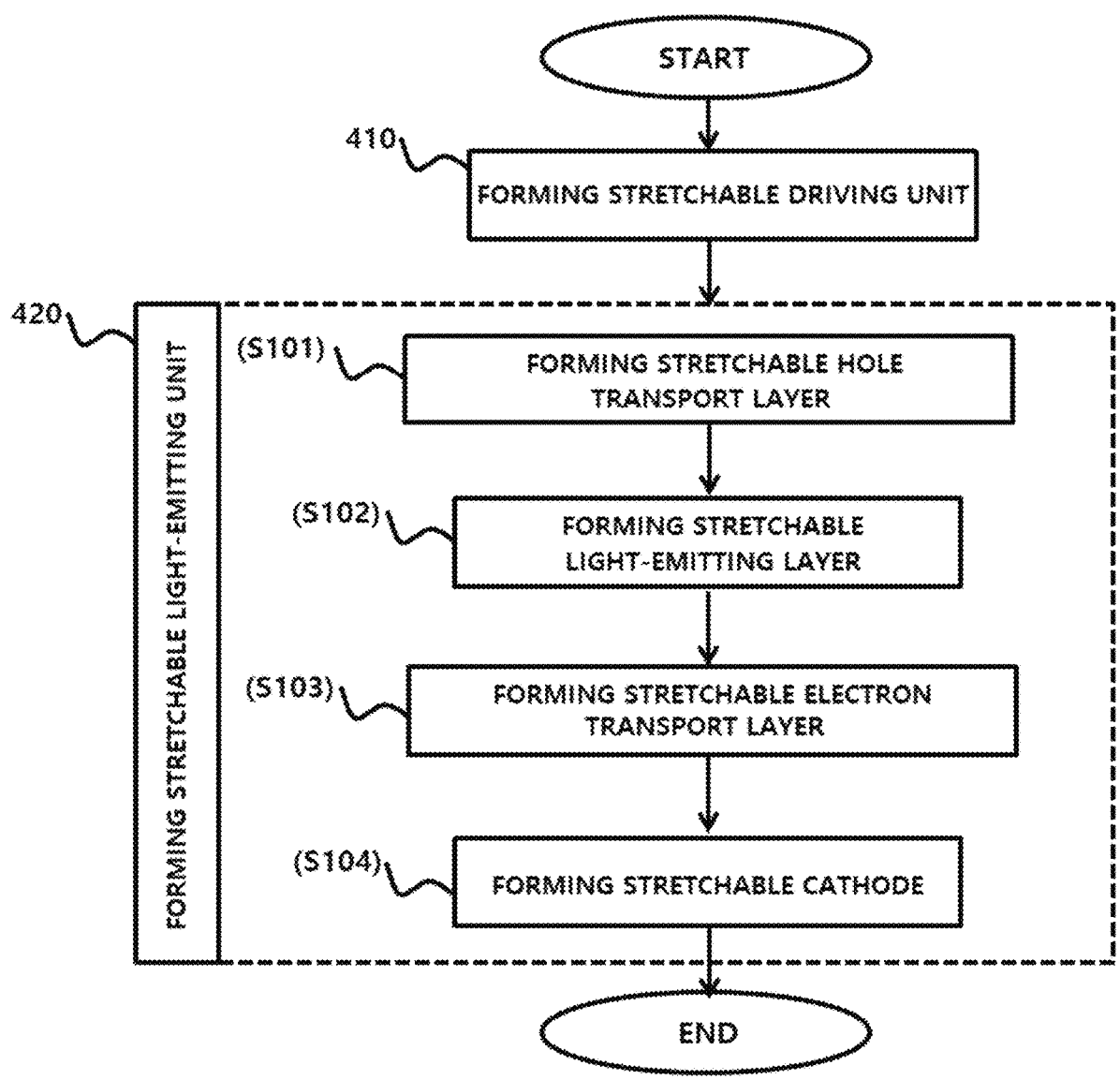
FIG. 6 is a view showing a manufacturing method of the organic light-emitting diode in another general aspect.

FIG. 6 is a view showing a manufacturing method of the stretchable organic light-emitting diode according to an exemplary embodiment described with reference to FIGS. 1 to 5. Hereinafter, a description overlapping the description of the stretchable organic light-emitting diode according to an exemplary embodiment is omitted among the description described with reference to FIG. 6.

In another general aspect, in a process 410, the manufacturing method of the organic light-emitting diode may include the forming of the stretchable driving unit including the stretchable field effect transistor (FET).

In another general aspect, the manufacturing method of the organic light-emitting diode may further include the following operations to form the stretchable FET: an operation S11 of forming a stretchable substrate; an operation S12 of forming a source electrode and a drain electrode on the stretchable substrate; an operation S13 of forming a semiconductor channel; an operation S14 of forming a gate dielectric film; and an operation S15 of forming a gate electrode.

In another general aspect, the stretchable FET may further include a metal wiring electrically connected to the source electrode, the drain electrode, or the gate electrode, and may further include each operation for forming these electrodes. In addition, it may further include forming an insulating layer after forming each metal wiring.

For example, the stretchable FET may include the source electrode, the drain electrode and the gate electrode, and the source electrode, and the drain electrode and the gate electrode may each be connected to the metal wiring.

For example, each layer included in the stretchable FET may be formed by at least one method selected from the spin coating, an inkjet printing and a slot die coating.

As described above, the stretchable FET may be formed of at least one material selected from the carbon nanotube and the nanowire. In detail, the stretchable FET 210 may include the source electrode formed of at least one material among the carbon nanotube (CNT) and the nanowire, the drain electrode, and the gate electrode, the channel material including the CNT or semiconductor polymer having a semiconductor property, and the gate dielectric film formed of the elastic polymer.

In another general aspect, in a process 420, the manufacturing method of the organic light-emitting diode may include forming the stretchable light-emitting unit including the elastic material after forming the stretchable driving unit.

In another general aspect, the manufacturing method of the organic light-emitting diode may include the following operations to form the stretchable light-emitting unit: an operation S101 of forming a stretchable hole transport layer (HTL) including a conductive polymer; and an operation S102 of forming a stretchable light-emitting layer (EML) including a light-emitting material on the stretchable hole transport layer. Next, the manufacturing method may further include: an operation S103 of forming a stretchable electron transport layer (ETL) including a metal oxide nanoparticle on the stretchable light-emitting layer; and an operation S104 of forming a stretchable cathode including a nanowire on the stretchable electron transport layer.

Meanwhile, the material included in the stretchable driving unit and the stretchable light-emitting unit and the manufacturing method thereof are described in detail above, a detailed description thereof is omitted.

The present disclosure may provide an organic light-emitting diode capable of implementing a stretchable image by implementing a stretchable light-emitting unit forming all of a hole transport layer, a light emitting layer, an electron transport layer, and a cathode using an elastic material on a stretchable driving unit. In addition, the organic light-emitting diode may have the stretchable light-emitting unit and the stretchable driving unit coupled to each other, and the display diode may thus minimize deterioration of its property even when the strain is applied thereto not only in uniaxial directions (x-axis and y-axis) but also in three-dimensional directions (x-axis, y-axis and z-axis) and may have little deterioration of its image quality.

In addition, according to the present disclosure, the organic light-emitting diode may have the stretchable driving unit and the stretchable light-emitting unit both manufactured by a solution process and may be transferred to a large area at a low voltage, thereby having a high economic advantage.

As a specific example, the description describes the property of the stretchable organic light-emitting diode manufactured according to the above-described manufacturing method.

Figure 7:
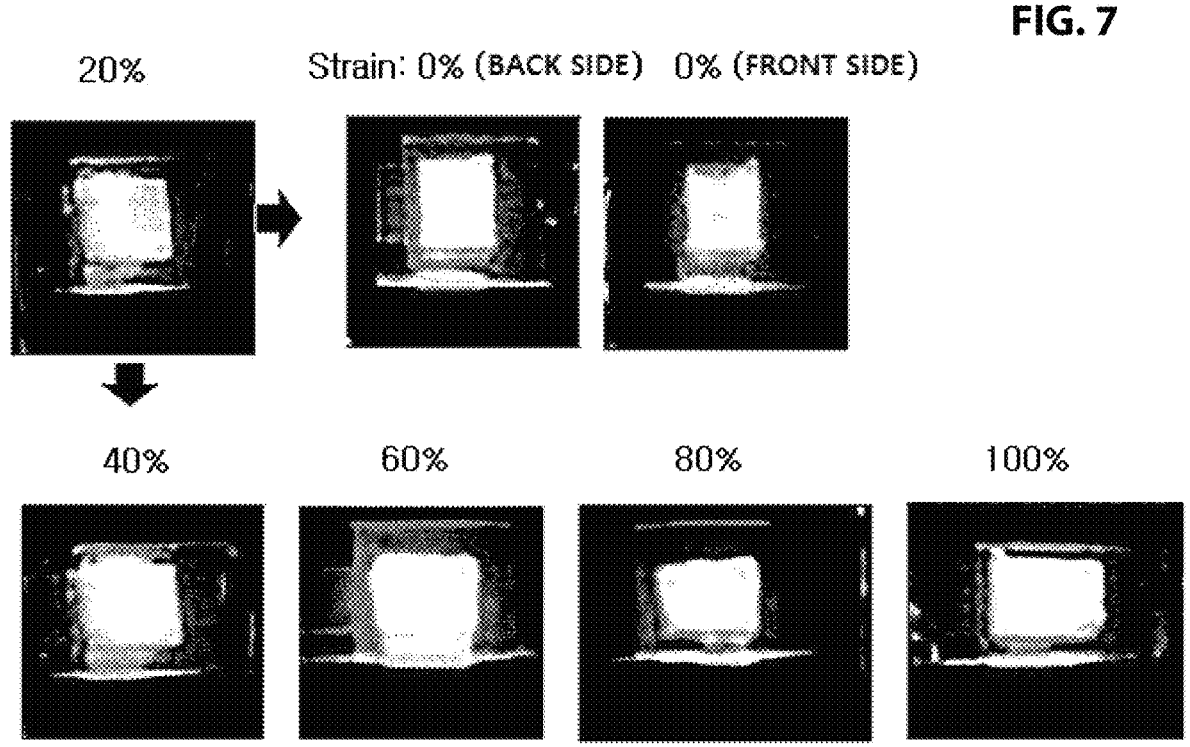
FIG. 7 is a view showing light-emitting property of the organic light-emitting diode in one general aspect, and confirming a change in the light-emitting property in a state in which a strain is applied to the organic light-emitting diode.

Referring to FIG. 7, it may be confirmed that the stretchable organic light-emitting diode according to an exemplary embodiment shows little change in its light-emitting property even when strains of 20%, 40%, 60%, 80% and 100% are applied thereto. Further, the stretchable organic light-emitting diode is confirmed to have no defect in its light-emitting property even when the strain of 20% is applied and then removed.

Figure 8:
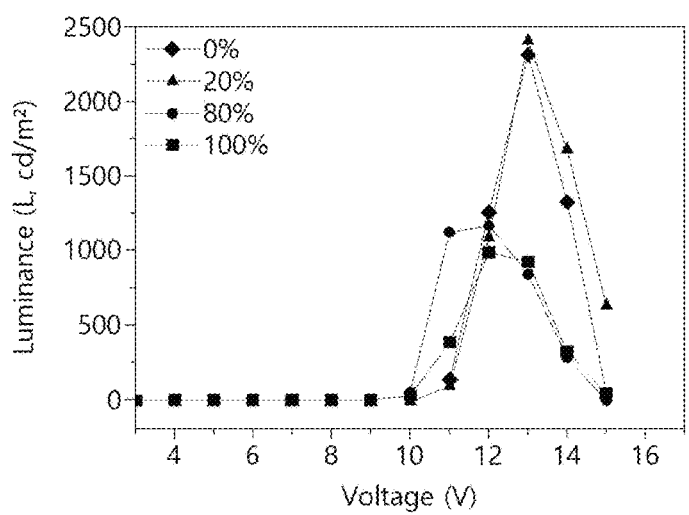
FIG. 8 is a view confirming luminance of the organic light-emitting diode in one general aspect in a state in which the strain is applied to the diode.

Referring to FIG. 8, it may be confirmed that the stretchable organic light-emitting diode according to an exemplary embodiment implements excellent luminance reaching 1,000 cd/cm$^2$ even from all results of static stretching tests performed in the state in which the strains of 20%, 40%, 60%, 80% and 100% are respectively applied thereto. In particular, it may be confirmed that when the strain of 20% is applied thereto, the diode implements the same level of luminance as that of a case where no strain (of zero %) is applied thereto.

Figure 9:
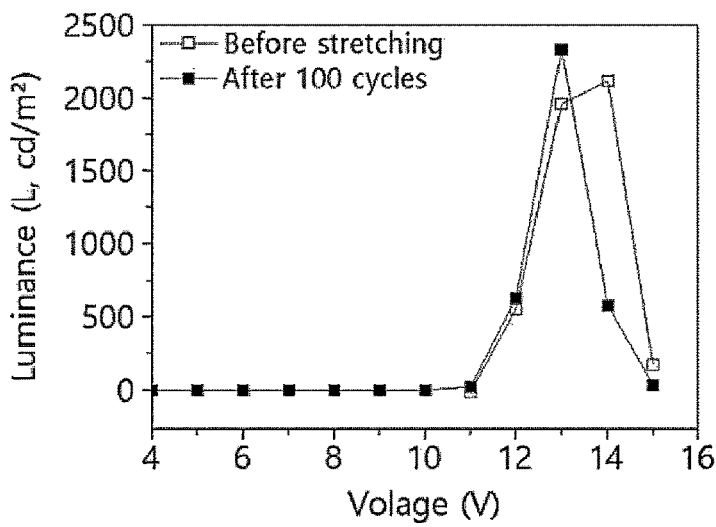
FIG. 9 is a view confirming the light-emitting property of the organic light-emitting diode in one general aspect in a state in which a strain of 20% or 40% is repeatedly applied thereto.
Figure 9:
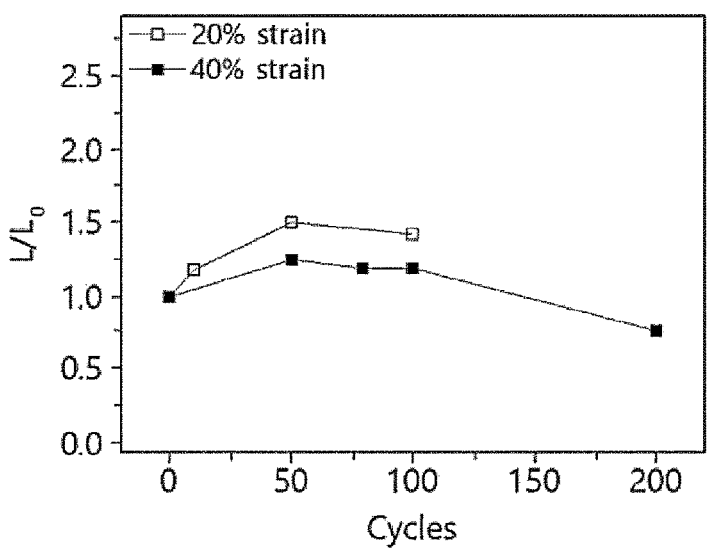
Figure 9:
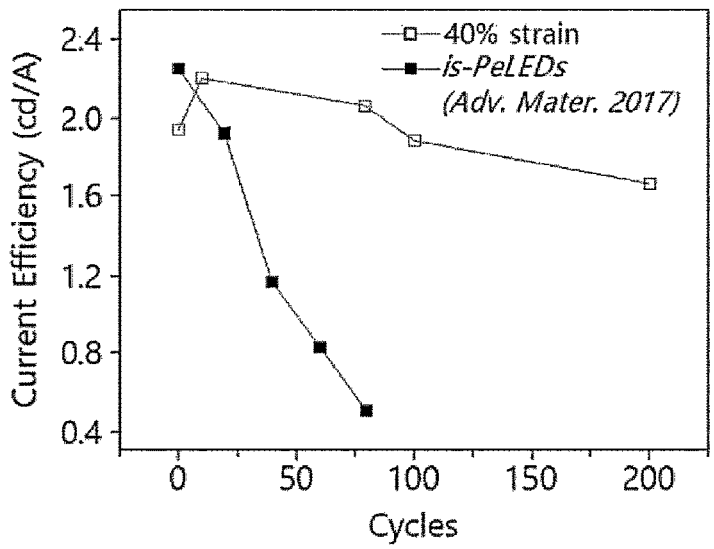

Referring to FIG. 9, it may be confirmed that the stretchable organic light-emitting diode according to an exemplary embodiment implements excellent light-emitting property even when the strain of 20% or 40% is repeatedly applied thereto. In detail, it may be confirmed that the stretchable organic light-emitting diode may implement a high luminance of 1,500 cd/cm$^2$ even when the strain of 20% or 40% is repeatedly applied thereto, and may implement stable luminance even when the strain is repeatedly applied thereto for 100 cycles. Here, the luminance property of the diode while the strain is repeatedly applied thereto may be defined as L/LO (L is a maximum luminance in the corresponding cycle; and LO is a maximum luminance in a zero cycle).

In addition, the comparison of the luminance properties is performed using a diode manufactured according to manufacturing methods disclosed in Nature Photonics 2013, 7, 817-824 (2013), ACS Nano 2014, 8, 2, 1590-1600 and Advanced Materials 2017, 29, 1607053. In addition, it may be confirmed that the stretchable organic light-emitting diode maintains stable current efficiency even when the strain of 40% is repeatedly applied thereto. Here, the comparison of the stabilities for the current efficiencies is performed using a diode manufactured according to the manufacturing method disclosed in Advanced Materials, 2017, 29, 1607053.

Figure 10:
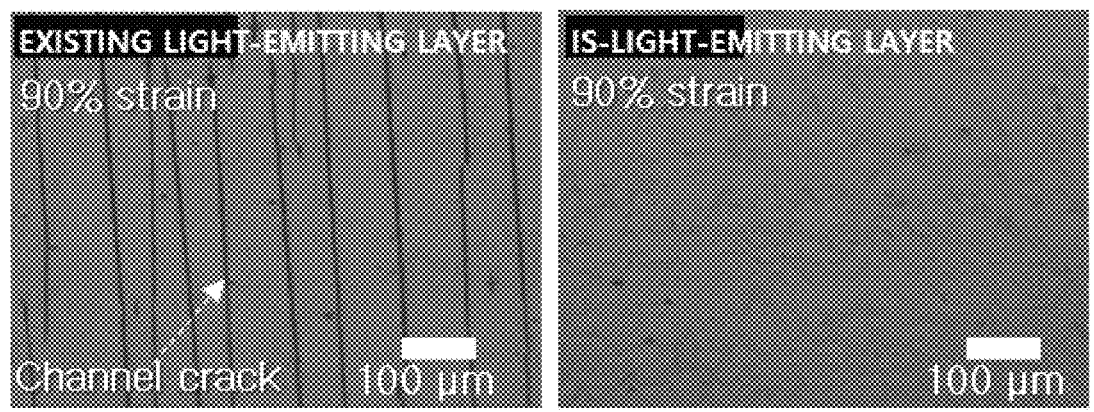
FIG. 10 is a view confirming a surface of the stretchable light-emitting unit of the organic light-emitting diode in one general aspect through an optical microscope in a state in which a strain of 90% is applied to the stretchable light-emitting unit and an existing light-emitting layer.

Referring to FIG. 10, it may be confirmed that no cracks occur on a surface of the stretchable organic light-emitting diode according to an exemplary embodiment even when a strain of 90% is applied thereto. In detail, as a result of measuring a crack onset strain, which is one of a mechanical property analysis of the stretchable organic light-emitting diode, through an optical microscope in real time, it may be confirmed that no cracks occur on any portion on its surface, and a plurality of cracks occurs on a surface of an existing light-emitting layer.

Figure 11:
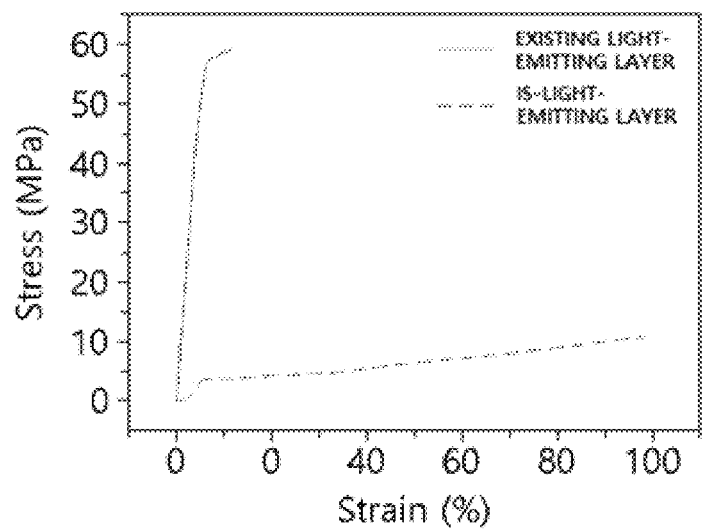
FIG. 11 is a view confirming a result of tensile tests for the stretchable light-emitting unit of the organic light-emitting diode in one general aspect and an existing light-emitting layer.
Figure 11:
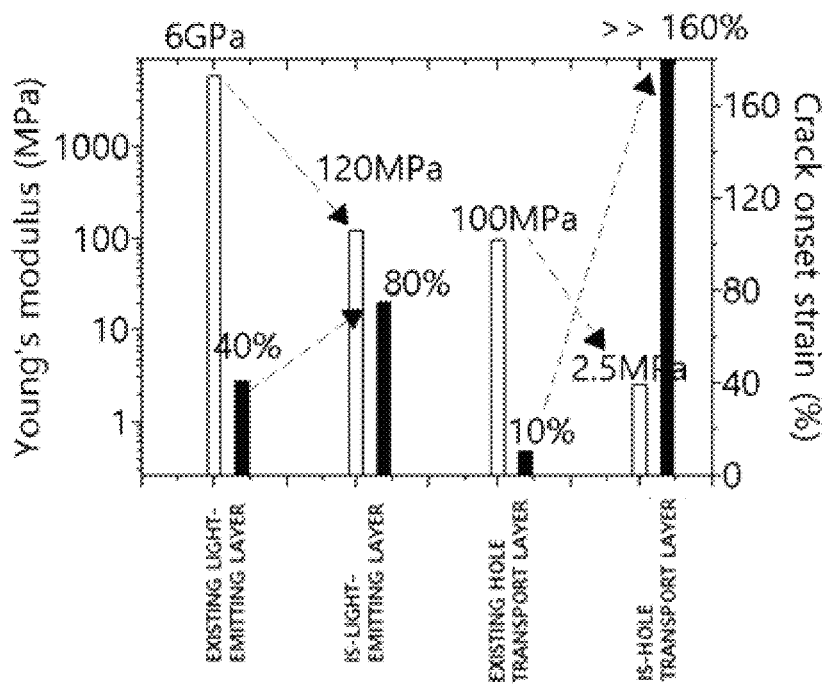

Referring to FIG. 11, as a result of a tensile test of the stretchable organic light-emitting diode according to an exemplary embodiment, its tensile property is remarkably superior to the existing light-emitting layer and an existing hole transport layer. That is, it is confirmed that the stretchable light-emitting layer and the stretchable hole transport layer show higher strains and lower moduli than the existing light-emitting layer and the existing hole transport layer, and may thus be more suitable for the stretchable organic light-emitting diode. Here, the existing light-emitting layer and the existing hole transport layer are manufactured according to the manufacturing method disclosed in Nature Photonics, 2013, 7, 817-824 (2013).

As shown above, the stretchable organic light-emitting diode may implement the excellent light-emitting property and the mechanical property, and may also stably maintain the light-emitting property and mechanical property of the display diode even when the strain is applied thereto not only in the uniaxial directions but also in the three-dimension directions. Accordingly, it is expected that the present disclosure may provide a more reliable display diode.

Hereinabove, although the exemplary embodiments are described with reference to the specific drawings, the present disclosure may be variously modified and changed from the above description by those skilled in the art to which the present disclosure pertains. For example, an appropriate result may be achieved even if the described techniques are performed in a order different from that of the described method, the described technologies are performed in a different order than the described method, and/or the components such as the described system, structure, device, circuit and the like are coupled or combined to each other in a form different from that of the described method, or the components are replaced or substituted by other components or equivalents.

Therefore, other implementations, other embodiments and those equivalent to the claims also fall within the scope of the claims to be described below.

REFERENCE NUMERALS

110: stretchable hole transport layer
120: stretchable light-emitting layer
130: stretchable electron transport layer
140: stretchable cathode
210: stretchable FET
220: stretchable bit-line
230: stretchable anode

The invention claimed is:

1. A stretchable organic light-emitting diode comprising:
   a stretchable driving unit including a stretchable field effect transistor (FET); and
   a stretchable light-emitting unit disposed on the stretchable driving unit and including an elastic material;
   wherein the stretchable light-emitting unit includes:
      a stretchable hole transport layer (HTL) including a conductive polymer;
      a stretchable light-emitting layer (EML) formed on the stretchable hole transport layer and including a light-emitting material;
      a stretchable electron transport layer (ETL) formed on the stretchable light-emitting layer and including a metal oxide nanoparticle; and
      a stretchable cathode formed on the stretchable electron transport layer and including a nanowire.

2. The stretchable organic light-emitting diode of claim 1, wherein the stretchable hole transport layer includes a nonionic surfactant and a conductive polymer nanofiber.

3. The stretchable organic light-emitting diode of claim 1, wherein the stretchable light-emitting layer includes one or a combination of two selected from the group consisting of an elastic polymer and a plasticizer, and the light-emitting material.

4. The stretchable organic light-emitting diode of claim 3, wherein the light-emitting material includes one or two or more selected from the group consisting of a fluorescent polymer, a fluorescent compound, a phosphorescent polymer and a phosphorescent compound,
   the elastic polymer includes one or two or more selected from the group consisting of a polybutadiene-based rubber, a silicone-based rubber and a polyethylene oxide-based rubber, and
   the plasticizer is a nonionic surfactant.

5. The stretchable organic light-emitting diode of claim 1, wherein the stretchable electron transport layer includes an n-type semiconductor metal oxide nanoparticle and an amine-based polymer doped with an n-type dopant.

6. The stretchable organic light-emitting diode of claim 1, wherein the stretchable driving unit includes the stretchable FET, a stretchable bit-line and a stretchable anode to control an on/off operation of each pixel of the stretchable light-emitting unit.

7. A manufacturing method of the stretchable organic light-emitting diode of claim 1 comprising:
   forming the stretchable driving unit including the stretchable field effect transistor (FET); and
   forming the stretchable light-emitting unit disposed on the stretchable driving unit and including the elastic material;
   wherein the forming of the stretchable light-emitting unit includes:
      forming the stretchable hole transport layer (HTL) including the conductive polymer;
      forming the stretchable light-emitting layer (EML) formed on the stretchable hole transport layer and including the light-emitting material;
      forming the stretchable electron transport layer (ETL) formed on the stretchable light-emitting layer and including the metal oxide nanoparticle; and
      forming the stretchable cathode formed on the stretchable electron transport layer and including the nanowire.

8. The manufacturing method of claim 7, wherein in the forming of the stretchable hole transport layer, a nonionic surfactant of a predetermined weight ratio is added into a solution containing the conductive polymer to change a structure of the conductive polymer to a nanofiber structure.

9. The manufacturing method of claim 7, wherein in the forming of the stretchable light-emitting layer, the stretchable light-emitting layer is formed by mixing one or two materials selected from the group consisting of an elastic polymer and a plasticizer with the light-emitting material.

10. The manufacturing method of claim 7, wherein the forming of the stretchable electron transport layer includes forming an n-type semiconductor metal oxide nanoparticle layer and forming an amine-based polymer layer doped with an n-type dopant.

* * * * *

UNITED STATES PATENT AND TRADEMARK OFFICE
CERTIFICATE OF CORRECTION

PATENT NO. : 11,647,654 B2
APPLICATION NO. : 17/182026
DATED : May 9, 2023
INVENTOR(S) : Jin-Woo Park and Jin-Hoon Kim It is certified that error appears in the above-identified patent and that said Letters Patent is hereby corrected as shown below:

On the Title Page

Item (54) and in the Specification, Column 1, Lines 1-4, Correct invention title from "ORGANIC LIGHT EMITTING DIODE, AND USING STRETCHABLE LIGHT-EMITTING MATERIAL AND A MANUFACTURING METHOD OF THEREOF" to "STRETCHABLE ORGANIC LIGHT-EMITTING DIODE COMPRISING A STRETCHABLE LIGHT-EMITTING UNIT INCLUDING AN ELASTIC MATERIAL, AND A MANUFACTURING METHOD THEREOF"

Signed and Sealed this
Twenty-seventh Day of June, 2023

Katherine Kelly Vidal
*Director of the United States Patent and Trademark Office*